(12) United States Patent
Hsu et al.

(10) Patent No.: US 7,581,200 B2
(45) Date of Patent: Aug. 25, 2009

(54) SYSTEM AND METHOD FOR ANALYZING LENGTH DIFFERENCES IN DIFFERENTIAL SIGNAL PATHS

(75) Inventors: Shou-Kuo Hsu, Taipei Hsien (TW); Cheng-Shien Li, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 306 days.

(21) Appl. No.: 11/552,975

(22) Filed: Oct. 26, 2006

(65) Prior Publication Data
US 2007/0139058 A1 Jun. 21, 2007

(30) Foreign Application Priority Data
Dec. 15, 2005 (CN) .......................... 2005 1 0120708

(51) Int. Cl.
*G06F 17/50* (2006.01)
(52) U.S. Cl. ............ 716/4; 716/1; 716/5; 716/11; 716/12; 716/14
(58) Field of Classification Search .......... 716/4, 716/5, 11, 12, 14; 333/111
See application file for complete search history.

(56) References Cited

U.S. PATENT DOCUMENTS

| | | | |
|---|---|---|---|
| 6,185,119 B1 * | 2/2001 | Haeberli et al. ............... 365/45 |
| 6,235,997 B1 * | 5/2001 | Asada et al. ................. 174/260 |
| 6,442,069 B1 * | 8/2002 | Srinivasan et al. ..... 365/185.21 |
| 6,643,831 B2 * | 11/2003 | Chang et al. .................... 716/4 |
| 6,765,413 B2 * | 7/2004 | Nakase .......................... 326/86 |
| 6,781,465 B1 | 8/2004 | Berzins et al. |
| 7,277,298 B2 * | 10/2007 | Ohsaka ........................ 361/760 |
| 7,307,492 B2 * | 12/2007 | Tripathi et al. .............. 333/111 |
| 7,346,880 B2 * | 3/2008 | Huang et al. .................. 716/12 |
| 7,421,673 B2 * | 9/2008 | Meyer et al. .................... 716/5 |

* cited by examiner

*Primary Examiner*—Helen Rossoshek
(74) *Attorney, Agent, or Firm*—Wei Te Chung

(57) ABSTRACT

A method for analyzing length differences in differential signal paths includes: loading a design file of the differential signal paths from a storage device (9); simulating the differential signal paths based on the design file; dividing simulated differential signal paths into a plurality of segments by impedance division positions that show impedance discontinuity; predefining an acceptable length difference limit for each divided segment, and calculating an real length difference for each divided segment; comparing the real length difference with the acceptable length difference limit correspondingly to generate a plurality of analyzed results corresponding to the plurality of divided segments; selecting one or more compared segments to check analyzed results of selected segments; and locating the selected segments in the simulated differential signal paths, and generating analyzed information comprising analyzed results of the selected segments. A related system is also disclosed.

4 Claims, 4 Drawing Sheets

SYSTEM AND METHOD FOR ANALYZING LENGTH DIFFERENCES IN DIFFERENTIAL SIGNAL PATHS

BACKGROUND OF THE INVENTION

1. Field of the Invention

The present invention generally relates to systems and methods for analyzing differential signal paths, and more particularly to a system and method for analyzing length differences in differential signal paths.

2. Description of Related Art

With the continuing technology advancement of computer systems, high-speed serial signals transmitted between components of the computer systems are essential in the computer systems. As schemes of transmitting high-speed serial signals with accurate time-oriented sequential controls are introduced, the differential signal paths have attracted attention. Each differential signal path is a scheme using a pair of signals whose phases are inverted from each other, and includes a first signal path S+ and a second signal path S−. In this scheme, binary serial data of "1" and "0" are transmitted as a phase-inverted signal pair.

Ideally, the first signal path S+ and the second signal path S− should have an equal length, and at a shortest possible distance away from each other. However, the first signal path S+ and the second signal path S− designed for a printed circuit board (PCB) do not have an equal length and the distance between them are not the shortest distance possible. That is, length differences between the first signal path S+ and the second signal path S− of the differential signal paths are inevitable. More attention must be paid to the length differences between the first signal path S+ and the second signal path S− of the differential signal paths before the differential signal paths are utilized.

Presently, people analyze the length differences between the first signal path S+ and the second signal path S− of a differential signal path by way of comparing the whole length of the first signal path S+ and the second signal path S− one with each other. However, the differential signal path must pass through impedance division positions such as, positions for configuring passive components and positions for configuring vias, which show impedance discontinuity. That is, the error of the length difference analyzed by people is huge.

What is needed, therefore, is a system and method that can be utilized to analyzing length differences between the first signal path S+ and the second signal path S− of differential signal paths, that can overcome the above-described problems by dividing the differential signal paths into a plurality of segments by impedance division positions, so as to accurately analyze length differences of the divided segments.

SUMMARY OF THE INVENTION

A system for analyzing length differences in differential signal paths in accordance with a preferred embodiment includes a storage device and an analyzing module. The storage device is configured for storing a design file of the differential signal paths. The analyzing module is configured for analyzing the differential signal paths to obtain analyzed information, and includes a simulator, a dividing sub-module, an analyzing sub-module, a selecting sub-module, and an output sub-module. The simulator is configured for loading the design file from the storage device, and for simulating the differential signal paths based on the design file. The dividing sub-module is configured for dividing simulated differential signal paths into a plurality of segments by impedance division positions that show impedance discontinuity. The analyzing sub-module is configured for predefining an acceptable length difference limit for each divided segment, for calculating an real length difference for each divided segment, and for comparing the real length difference with the acceptable length difference limit correspondingly to generate a plurality of analyzed results corresponding to the plurality of divided segments. The selecting sub-module is configured for selecting one or more segments compared by the analyzing sub-module to check analyzed results of selected segments. The output sub-module is configured for locating the selected segments in the simulated differential signal paths, and for generating the analyzed information comprising analyzed results of the selected segments.

A method for analyzing length differences in differential signal paths in accordance with a preferred embodiment includes the steps of: loading a design file of the differential signal paths from a storage device; simulating the differential signal paths based on the design file; dividing simulated differential signal paths into a plurality of segments by impedance division positions that show impedance discontinuity; predefining an acceptable length difference limit for each divided segment, and calculating an real length difference for each divided segment; comparing the real length difference with the acceptable length difference limit correspondingly to generate a plurality of analyzed results corresponding to the plurality of divided segments; selecting one or more compared segments to check analyzed results of selected segments; and locating the selected segments in the simulated differential signal paths, and generating analyzed information comprising analyzed results of the selected segments.

Other advantages and novel features of the present invention will become more apparent from the following detailed description of preferred embodiments when taken in conjunction with the accompanying drawings.

DETAILED DESCRIPTION OF THE INVENTION

Figure 1:
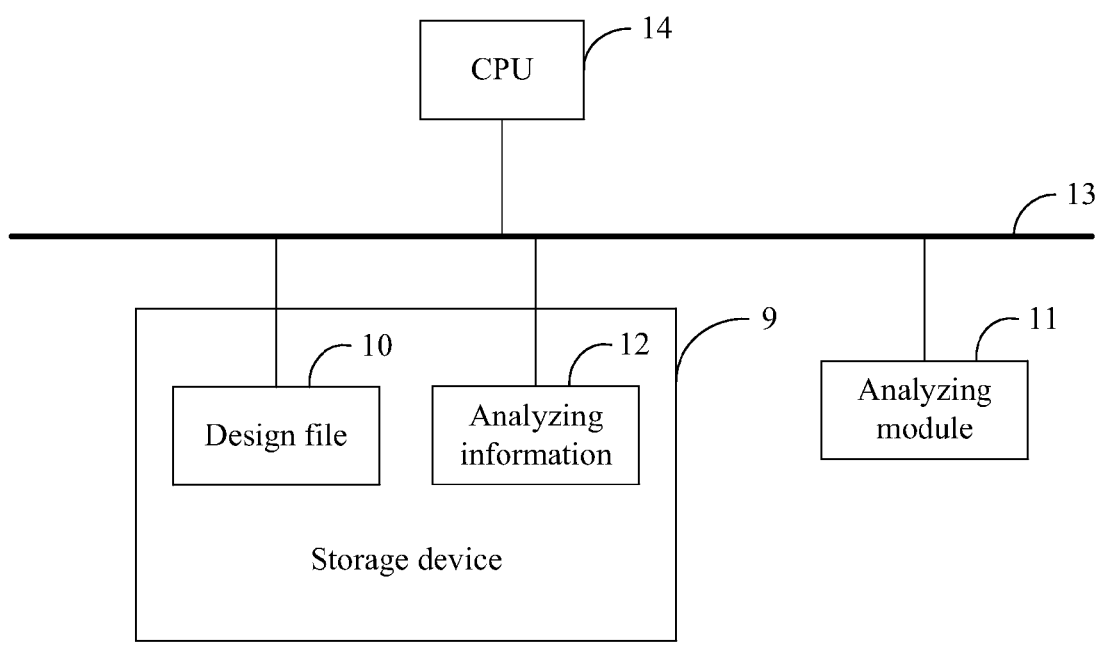
FIG. 1 is a schematic diagram of a hardware configuration of a system for analyzing length differences in differential signal paths in accordance with a preferred embodiment.

FIG. 1 is a schematic diagram of a hardware configuration of a system for analyzing length differences in differential signal paths (hereinafter, "the system") in accordance with a preferred embodiment. The system may include a storage device 9, an analyzing module 11, a universal serial bus (USB) 13, and a central processing unit (CPU) 14 connected with the storage device 9 and the analyzing module 13 via the USB 13. The storage device 9 typically includes two allocated space—one is configured for storing a design file 10 of the differential signal paths of a printed circuit board (PCB), and another is configured for storing analyzed information 12 of the differential signal paths based on the design file 10. The analyzing module 11 is configured for analyzing the differential signal paths to obtain the analyzed information 12, and transmitting the analyzed information 12 to the storage device 9. The CPU 14 is configured for processing data between the storage device 9 and the analyzing module 13. The USB 13 is configured for transmitting the data between the storage device 9 and the analyzing module 13.

Figure 2:
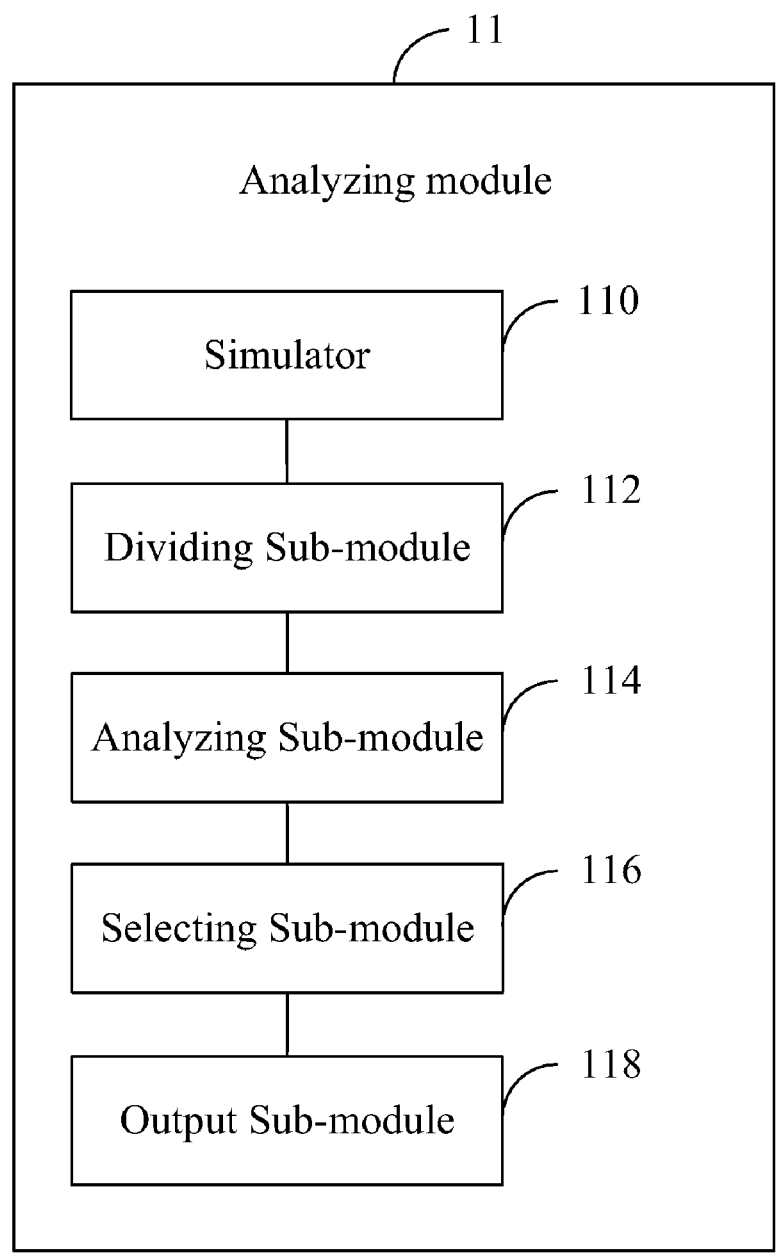
FIG. 2 is a schematic diagram of main function sub-modules of an analyzing module of the system of FIG. 1.

FIG. 2 is a schematic diagram of main function sub-modules of the analyzing module 11. The analyzing module 11 includes a simulator 110, a dividing sub-module 112, an analyzing sub-module 114, a selecting sub-module 116, and an output sub-module 118.

The simulator 110 is configured for loading the design file 10 from the storage device 9, and for simulating the differential signal paths based on the design file 10. Each differential signal path includes a first signal path S+ and a second signal path S−.

The dividing sub-module 112 is configured for dividing simulated differential signal paths into a plurality of segments by impedance division positions that show impedance discontinuity. In the preferred embodiment, the impedance division positions typically include positions for configuring passive components and positions for configuring vias.

The analyzing sub-module 114 is configured for analyzing a length difference between the first signal path S+ and the second signal path S− in each segment. In the preferred embodiment, the analyzing sub-module 114 is configured for predefining an acceptable length difference limit between the first signal path S+ and the second signal path S− in each segment, for calculating a real length difference for each segment by comparing the length of the first signal path S+ and the length of the second signal path S− in each segment, and for comparing the real length difference with the acceptable length difference limit correspondingly to generate a plurality of analyzed results on all segments.

The selecting sub-module 116 is configured for selecting one or more segments analyzed by the analyzing sub-module 114 to check analyzed results of the selected segments.

The output sub-module 118 is configured for locating selected segments in the simulated differential signal paths, for highlighting the selected segments with a predefined color, for generating analyzed information of the selected segments, and for transmitting generated analyzed information to the storage device 9. The generated analyzed information typically includes a number of the selected segments, the real length difference between the first signal path S+ and the second signal path S− in each selected segment, the acceptable length difference limit of each selected segment, and the analyzed result of each selected segment.

Figure 3:
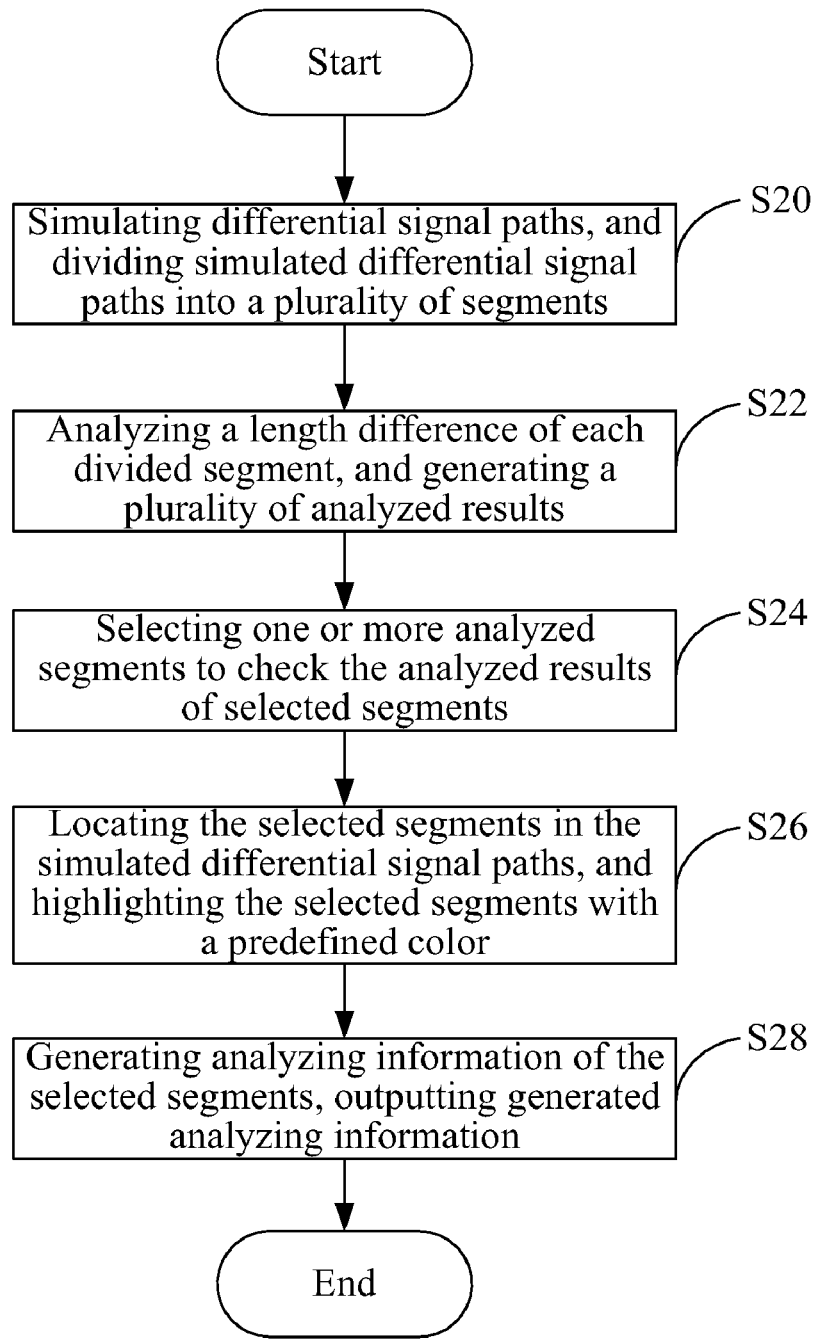
FIG. 3 is a flowchart of a method for analyzing length differences in differential signal paths in accordance with a preferred embodiment.

FIG. 3 is a flowchart of a method for analyzing length differences in differential signal paths in accordance with a preferred embodiment. In the preferred embodiment, the system may be used to analyze length differences between the first signal path S+ and the second signal path S− in the differential signal paths based on the design file 10. In step S20, the CPU 14 activates the analyzing module 11. The simulator 110 loads the design file 10 from the storage device 9, and simulates the differential signal paths based on the design file 10. The dividing sub-module 112 divides simulated differential signal paths into a plurality of segments by impedance division positions that show impedance discontinuity. The impedance division positions typically include positions for configuring passive components and positions for configuring vias.

In step S22, the analyzing sub-module 114 analyzes a length difference between the first signal path S+ and the second signal path S− in each segment, and generates the plurality of analyzed results corresponding to the plurality of segments.

In step S24, the selecting sub-module 116 selects one or more segments analyzed by the analyzing sub-module 114 to check analyzed results of the selected segments.

In step S26, the output sub-module 118 locates the selected segments in the simulated differential signal paths, and highlights the selected segments with the predefined color.

In step S28, the output sub-module 118 generates analyzed information of the selected segments, transmits generated analyzed information to the storage device 9. The generated analyzed information typically includes the number of the selected segments, the real length difference between the first signal path S+ and the second signal path S− in each selected segment, the acceptable length difference limit of each selected segment, and the analyzed result of each selected segment.

Figure 4:
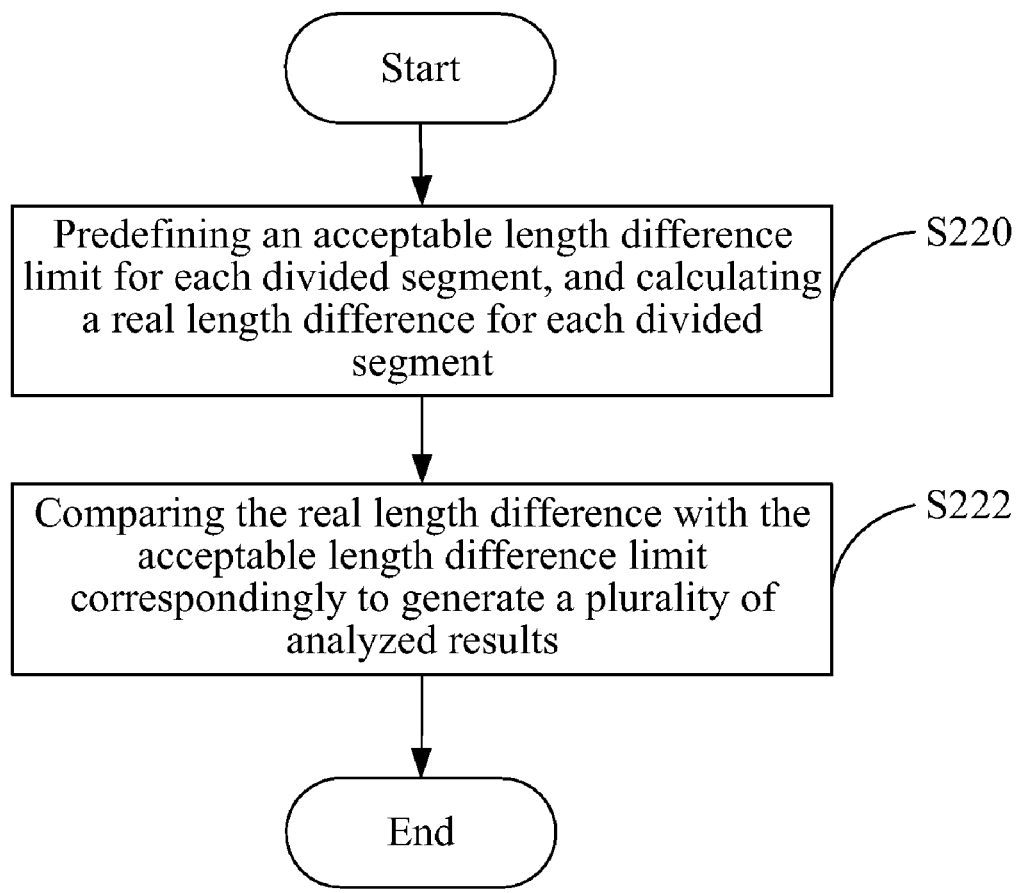
FIG. 4 is a flowchart of a method for analyzing a length difference in each segment of the differential signal paths of FIG. 3.

FIG. 4 is a flowchart illustrating the detail of a step of FIG. 3, namely analyzing a length difference between the first signal path S+ and the second signal path S− in each segment. In step S220, the analyzing sub-module 114 predefines an acceptable length difference limit for each segment, and calculates a real length difference for each segment by comparing the length of the first signal path S+ and the length of the second signal path S− in each segment.

In step S222, the analyzing sub-module 114 compares the real length difference with the acceptable length difference limit correspondingly to generate the plurality of analyzed results on all segments.

It should be emphasized that the above-described embodiments of the preferred embodiments, particularly, any "preferred" embodiments, are merely possible examples of implementations, merely set forth for a clear understanding of the principles of the invention. Many variations and modifications may be made to the above-described preferred embodiment(s) without departing substantially from the spirit and principles of the invention. All such modifications and variations are intended to be included herein within the scope of this disclosure and the above-described preferred embodiment(s) and protected by the following claims.

What is claimed is:

1. A system for analyzing length differences in differential signal paths, the system comprising:

a storage device configured for storing a design file of the differential signal paths; and an analyzing module configured for analyzing the differential signal paths to obtain analyzed information, the analyzing module comprising:

a simulator configured for loading the design file from the storage device, and configured for simulating the differential signal paths based on the design file;

a dividing sub-module configured for dividing simulated differential signal paths into a plurality of segments by impedance division positions that show impedance discontinuity;

an analyzing sub-module configured for predefining an acceptable length difference limit for each divided segment, configured for calculating a real length difference for each divided segment, and configured for comparing the real length difference with the acceptable length difference limit correspondingly to generate a plurality of analyzed results corresponding to the plurality of divided segments;

a selecting sub-module configured for selecting one or more segments compared by the analyzing sub-module to check analyzed results of selected segments; and an output sub-module configured for locating the selected segments in the simulated differential signal paths, configured for highlighting the selected segments with a predefined color, configured for generating the analyzed information comprising analyzed results of the selected segments, and configured for storing the analyzed information into the storage device.

2. The system as claimed in claim 1, wherein the analyzed information further comprises a number of the selected segments, the real length difference of each selected segment, and the acceptable length difference limit of each selected segment.

3. A method for analyzing length differences in differential signal paths, the method comprising the steps of:

loading a design file of the differential signal paths from a storage device;

simulating the differential signal paths based on the design file;

dividing simulated differential signal paths into a plurality of segments by impedance division positions that show impedance discontinuity;

predefining an acceptable length difference limit for each divided segment, and calculating an real length difference for each divided segment;

comparing the real length difference with the acceptable length difference limit correspondingly to generate a plurality of analyzed results corresponding to the plurality of divided segments;

selecting one or more compared segments to check analyzed results of selected segments;

locating the selected segments in the simulated differential signal paths, and highlighting the selected segments with a predefined color;

generating analyzed information comprising analyzed results of the selected segments; and storing the analyzed information into the storage device.

4. The method as claimed in claim 3, wherein the analyzed information further comprises a number of the selected segments, the real length difference of each selected segment, and the acceptable length difference limit of each selected segment.

* * * * *